United States Patent
Sicard (10) Patent No.: US 12,244,314 B2
(45) Date of Patent: Mar. 4, 2025

(54) ELECTRONIC INTEGRATOR CIRCUIT FOR DRIVING INDUCTOR

(71) Applicant: NXP USA, Inc., Austin, TX (US)

(72) Inventor: Thierry Michel Alain Sicard, Auzeville Tolosane (FR)

(73) Assignee: NXP USA, Inc., Austin, TX (US)

( * ) Notice: Subject to any disclaimer, the term of this patent is extended or adjusted under 35 U.S.C. 154(b) by 95 days.

(21) Appl. No.: 17/903,492

(22) Filed: Sep. 6, 2022

(65) Prior Publication Data

US 2023/0147110 A1 May 11, 2023

(30) Foreign Application Priority Data

Nov. 8, 2021 (EP) ..................................... 21306564

(51) Int. Cl.
*H03K 4/50* (2006.01)
*H03K 17/687* (2006.01)

(52) U.S. Cl.
CPC ........... *H03K 4/50* (2013.01); *H03K 17/6871* (2013.01)

(58) Field of Classification Search
CPC ....... H03K 4/50; H03K 17/6871; G06G 7/184
See application file for complete search history.

(56) References Cited

U.S. PATENT DOCUMENTS

| 6,670,796 B2 | 12/2003 | Mori |
| 2020/0266702 A1* | 8/2020 | Zhao ........................ H03K 4/06 |
| 2022/0224367 A1 | 7/2022 | Sicard et al. |

FOREIGN PATENT DOCUMENTS

EP 0337857 B1 3/1993

OTHER PUBLICATIONS

Groenewold et al., "Systematic Distortion Analysis for MOSFET Integrators with Use of a New MOSFET Model," IEEE Transactions On Circuits And Systems, II: Analog And Digital Signal Processing, vol. 41, No. 9, Sep. 1994, pos 569-580; 12 pages.

* cited by examiner

*Primary Examiner* — Metasebia T Retebo (57) ABSTRACT

An apparatus includes a first transistor including a first gate, a first drain and a first source. A second transistor includes a second gate and a second source, the second gate is coupled to a first current source configured to generate a linear current ramp, the second source is coupled to the first gate and a second current source configured to generate a constant current through the second transistor determined by a sampled voltage between the first gate and the first source. A third transistor includes a third gate and a third source, the third gate is coupled to the first drain, and the third source is coupled to an inductive load, wherein the third transistor is configured to source a load current to the inductive load in response to an integration of the linear current ramp. A first capacitor is coupled between the third source and the second gate.

20 Claims, 8 Drawing Sheets

ELECTRONIC INTEGRATOR CIRCUIT FOR DRIVING INDUCTOR

CROSS-REFERENCE TO RELATED APPLICATIONS

This application is a utility application claiming priority to co-pending E.P. Patent Application Number EP21306564 filed on Nov. 8, 2021 entitled "ELECTRONIC INTEGRATOR CIRCUIT FOR DRIVING INDUCTOR," the entirety of which is incorporated by reference herein.

FIELD

The present disclosure relates generally to electronic integrator circuits, and more specifically, to an integrator circuit that drives an inductive coil.

BACKGROUND

Electronic integration ("integrator") circuits are well-known and readily available for a number of electronic applications. A conventional integrator circuit includes an operational amplifier that provides a desired current response, wave shape, or other signal conditioning functions. However, the use of a conventional operational amplifier in the integrator circuit prevents the integrator circuit from producing the peak current requirements with sufficient linearity and speed necessary for driving a small inductive coil.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments described herein provide for the integration of a current ramp to develop and drive a high peak current through an inductive load in a short period of time. An efficient implementation of this integrator is based primarily on three transistors and an integrator capacitor. The simplicity of the design permits faster integration than compared to previous solutions based on traditional operational amplifiers. Furthermore, good linearity is achieved during the integration by compensating for a drain current dependency of a transistor with respect to the transistor gate to source voltage. Specifically, the integrator is temporarily biased to a mid-supply operating point to determine an average drain current of an integrating transistor. The average drain current is determined by a gate to source voltage of a first stage transistor, which is sampled and held for further use. This sampled voltage is subsequently used to force the drain current of the integrator transistor to be constant during integration of a current ramp, thereby ensuring that substantially all of the current from the current ramp flows to the integrator capacitor. The first stage transistor drives a final stage transistor used to drive the inductive load, where a gate of the first stage transistor follows the source voltage of the integrator transistor. Accordingly, the integrator integrates a linear sloped current ramp (t) to provide a quadratic voltage signal (t2) across the inductive load. The quadratic voltage results in a third order (t3) current through the inductive load as determined by the equation V=L*di/dt, where V is the applied voltage across the load, L is the inductance of the load, and di/dt is a rate of current change through the load. In one embodiment, the applied voltage across the load ranges from 0-2.5V, over a 6 ns integration cycle resulting in a drive current of 150 mA into a 30 nH inductive load.

Figure 1:
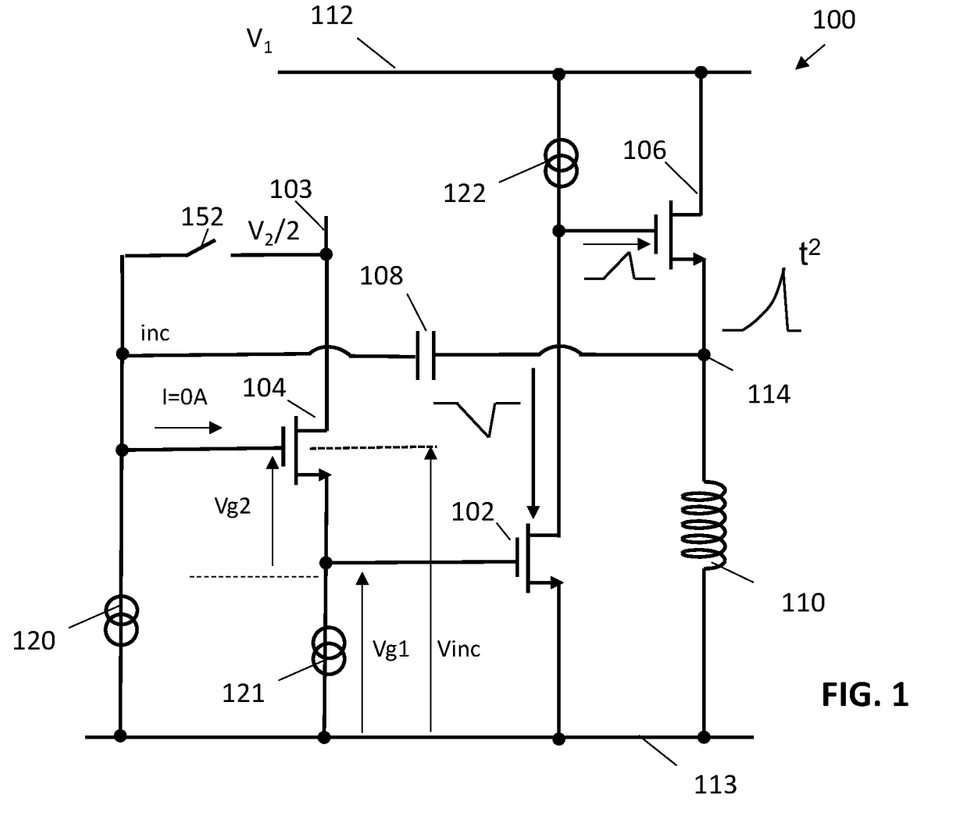
FIG. 1 is a schematic representation of an integrator circuit, in accordance with an embodiment of the present disclosure.

FIG. 1 is a schematic diagram of an integrator circuit 100, in accordance with some embodiments. The integrator circuit 100 can be implemented in various electronic applications including, but by no means limited to, automotive, industrial, and consumer applications including signal processing or battery management systems. One application includes the implementation of a computer chip or related electronic integrator circuit for a communication bus. As shown in FIG. 1, the integrator circuit 100 can drive an inductive load 110, for example, a primary coil of a transformer.

As shown in FIG. 1, the integrator circuit 100 may comprise a first transistor 102 (e.g., the first stage transistor), a second transistor 104 (e.g., the integrator transistor), a third transistor 106 (e.g., the final stage transistor), and the integrator capacitor 108. In some embodiments, one or more of the first transistor 102, second transistor 104, and third transistor 106 may be a Metal—Oxide—Semiconductor Field-Effect Transistor (MOSFET). In other embodiments, one or more of the transistors 102, 104, 106 may be an Insulated-Gate Field Effect transistor (IGFET). The three transistors 102, 104, 106 may collectively drive a current, (e.g., 150 mA, in the coil in 6 ns), and produce negligible or no input current at the gate of the second transistor 104, resulting in the integration of a linear input current with good linearity, high peak current and within the short period of time necessary for driving small inductive loads.

The first transistor 102 is coupled between a current source 122 and a ground terminal 113. The current source 122 is coupled to a voltage supply V1 112 (e.g. 5V). The current source 122 may provide a source of current, (e.g., 2 mA), to the drain of the first transistor 102. The third transistor 106 has a gate coupled to the drain of the first transistor 102 and to the current source 122, so that the first transistor 102 may drive the third transistor 106. The third transistor 106 may be configured to drive an inductive load 110 (e.g, a coil). The third transistor 106 may have a source coupled to both the integrator capacitor 108 and the inductive load 110 and a drain coupled to the voltage supply 112.

The gate of the first transistor 102 may be coupled to a source of the second transistor 104 and to a current source 121 connected to the ground terminal 113. The current source 121, may provide a constant current as a function of a sampled gate to source voltage (not shown) of the first transistor 102, determined prior to applying the current ramp to a gate of the second transistor 104. As described below, the current source 121 may provide a constant current to the second transistor 104 for the duration of the integration of the linear current ramp. In one embodiment, the gate of the second transistor 104 may be temporarily connected by a switch 152 (e.g., a transistor) to a voltage supply V2/2 103 (e.g., 3.0V/2 or 1.5V), prior to integrating the current ramp generated by an input current source 120. In another embodiment, the gate of the second transistor 104 may be temporarily connected to a mid-supply voltage, where the mid-supply voltage is substantially half of a maximum peak current that the integrator circuit 100 may provide on the output node 114.

The input current source 120 may be coupled to the both the gate of the second transistor 104 and the integrator capacitor 108. The second transistor 104 is configured so that a source of current from the input current source 120 flows via an input node (the gate of the second transistor 104 or "inc") to the integrator capacitor 108 resulting in substantially no current flowing to the second transistor 104. Specifically, the switch 152 temporarily biases the gate of the second transistor to a mid-supply, or average operating point of the integrator circuit 100, so that the sampled gate to source voltage of the first transistor 102, and thus the constant current provided by the current source 121, represent an average operating point of the integrator itself.

The first transistor 102 and the second transistor 104 are cascaded, resulting in a gate-source voltage (Vg1) of the first transistor 102 being added to a gate-source voltage (Vg2) of the second transistor 104 to provide the voltage (Vinc) at the gate input of the second transistor 104. The integrator capacitor 108 also provides feedback from the output node 114 to the gate of the second transistor 104 (e.g., the integrator input), similar to a negative feedback loop between an output and inverting input of a conventional operational amplifier. For example, when a voltage at the output node 114 increases, the gate voltage of 104 may increase due to capacitive coupling through the integrator capacitor 108. This in turn increases the drive current of the second transistor 104, which increases the drive current of the first transistor 102 and reduces the drive current of the third transistor 106, thereby countering the increase in the output node 114. This provides stability for the integrator circuit 100 due to transient voltages.

A constant current through the second transistor 104 is maintained during integration, regardless of a change in voltage Vg1 or voltage Vg2. For example, a decrease in voltage Vg1 at the first transistor 102 can be compensated for by an increase in voltage Vg2 at the second transistor 104 so that the combined voltage at the gate of the second transistor 104 remains unchanged.

Figure 2:
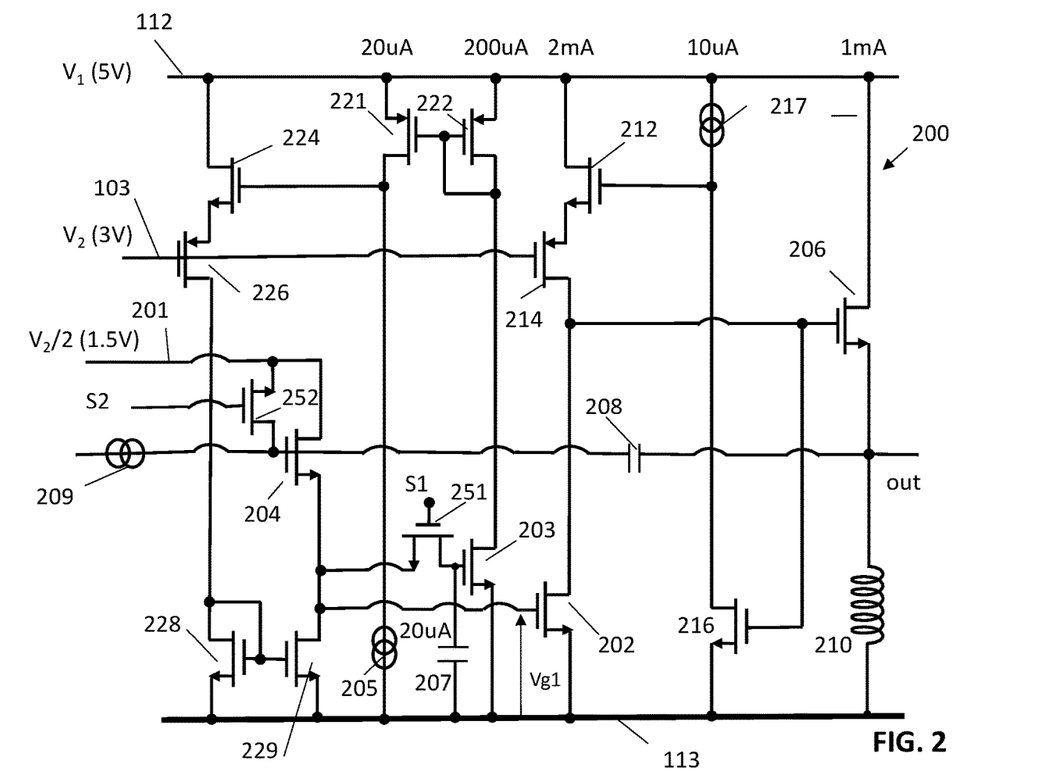
FIG. 2 is a schematic representation of an integrator circuit, in accordance with another embodiment of the present disclosure.

FIG. 2 is a schematic representation of an integrator circuit 200, in accordance with another embodiment. As shown, the integrator circuit 200 can be part of an isolated communication bus or the like, for example, a capacitive isolation line at a transmit side of a transformer of a bus. The integrator circuit 200 comprises a first transistor 202, a second transistor 204, a third transistor 206, and an integrator capacitor 208, which may be the same or similar to the transistors 102-106 and capacitor 108 described with reference to FIG. 1, but may be configured and arranged in the circuit 200 in a different manner than the circuit 100 of FIG. 1. The third transistor 206 may sink up to 1 mA from the voltage supply 112. During the rapid voltage increase required across the inductive load (e.g., coil) 210, the gate of the third transistor 206 is charged through transistors 212 and 214 with up to 2 mA of current from the voltage supply 112.

A transistor 216 sets a 1 mA Direct Current (DC) operating point to the third transistor 206. The transistor 216 may be considered a "copy" of the third transistor 206, in that the two transistors share similar electrical characteristics (e.g., same polarity and layout), with the exception of gain, determined by a transistor channel width. In an embodiment, the transistor 216 has 100 times less gain than the third transistor 206 (e.g., the gate and thus channel width of the transistor 206 is 100 times wider than the gate of the transistor 216). The transistor 216 is forced to conduct 10 uA though a current source 217, which results in a 1 mA bias to the third transistor 206 due to the 100 times gain difference between the transistor 216 and the third transistor 206. A closed loop is formed with transistors 212 and 214 driving the shared gate connection to transistors 216 and 206 in response to the drain voltage of the transistor 216.

A 2 mA DC operating point of transistors 212 and 214 and also transistor 202 is set in a different manner to the operating point of the third transistor 206, by using a transistor 203. Similar to the relationship between the transistor 216 and 206, the transistor 203 is a "copy" of the first transistor 202, in that these two transistors have similar electrical characteristics but transistor 203 is designed with 1/10 of the gain of the first transistor 202 and has a DC operating point of 200 uA. The transistor 203 sets the DC operating point of the first transistor 202 as a consequence of defining the drain to source current (IDS) of the second transistor 204 and ensuring that the IDS of the second transistor 204 remains constant during the integration of the input current ramp applied to the gate of the second transistor 204. The transistor 203 is used to define a constant IDS current through the second transistor 204 with a sample and hold process defined below.

The transistor 203 has a DC operating point of 200 uA as a result of a current source 205 being mirrored with p-type transistors 221 and 222, where a gain of transistor 222 is 10 times larger than a gain of the transistor 221. The drain voltage of the p-type transistor 221 drives the gate of a transistor 224. A resulting current though a branch formed by transistors 224, 226 and 228 is mirrored with a current mirror formed by transistors 228 and 229, thereby forcing a constant IDS current through the second transistor 104 defined by the gate voltage of transistor 203.

An input current source 209, similar to the current source 120 of FIG. 1 is configured to source a linear sloped current ramp to the gate of the second transistor 204 during an integration phase, following a preset phase used to set an operating point of the integrator circuit 200. An example of the input current source 209 is described below with reference to FIG. 7. In one embodiment, the input current source 209 is activated by opening a switch S2 252.

In one example, the transistors 226 and 214 are biased to 3V, thus providing sufficient "voltage headroom" for the current mirror formed by transistors 221 and 222 and thereby an effective output range of 3V for driving the inductive load 210. During the preset phase, the gate input to the second transistor 204 is shorted to a mid-supply voltage level 201 (e.g., 1.5V) by the switch S2 252 and further stored across the integrator capacitor 208 to establish an average DC operating value for the integrator circuit 200.

The gate to source voltage (VGS) of transistor 203 and the capacitor 207 connected thereto is set to be the same as the VGS of the first transistor 202 by closing a switch S1 formed by transistor 251 to connect the respective gates of transistors 202 and 203. Subsequently, the switch S1 251 is opened to "sample" the VGS voltage of the first transistor 202 and "hold" it across the capacitor 207. Accordingly, the VGS voltage of the transistor 203, set by the stored voltage on the capacitor 207 establishes a fixed current through the second transistor 204 and transistor 229 representing an average DC bias of the integrator circuit 100, which remains constant regardless of VGS voltage variations in the second transistor 204 during a subsequent integration phase.

The integration phase begins by opening the switch S2 252 and activating the input current source 209. In one embodiment the input current source is activated by opening a similar S2 switch within the input current source 209. In the embodiment shown in FIG. 2, the switch S1 251 is opened (e.g., turned off) by transitioning a gate voltage of the switch S1 251 from 1.5V (voltage 201) to 0V (ground 113). The switch S2 252 is opened (e.g., turned off) by transitioning a gate voltage of the switch 252 from 3.0V (voltage 103) to 1.5V (voltage 201).

During the integration phase the VGS of the first transistor 202 and the second transistor 204 will vary, however the IDS current through the second transistor 204 will remain constant due to the current mirror including transistor 229 forcing a constant current set by the sampled voltage on the capacitor 207 during the preset phase. Accordingly, the voltage sum (Vinc of FIG. 1) of the VGS of the transistors 202 and 204 will remain constant and thus substantially all of the current sourced by the input current source 209 will flow to the capacitor 208 to provide a quadratic voltage (t**2) across the inductive load 210.

Specifically, as current is sourced from transistor 214 towards the gate of the third transistor 206 (e.g., from 0 mA up to 1.5 mA), a corresponding reduction in current flows through the first transistor 202 (e.g., from 2 mA down to 0.5 mA). This reduction in IDS current of the first transistor 202 will cause a reduction in VGS of the first transistor with a corresponding increase in VGS of the second transistor. Thus, the source voltage the second transistor 204 will ramp linearly in proportion to the input current ramp from the input current source 209, as the current mirror including transistor 229 forces the constant IDS current through the second transistor 204. In one embodiment, the integration current of up to 700 uA, integrated across the capacitor 208 (e.g., a 1 pF capacitor), provides the desired quadratic (t2) voltage waveform up to 2.5V across a 30 nH inductive load 210. The inductive load 210 thus sinks up to 150 mA with a third order current waveform (t3).

Figure 3A:
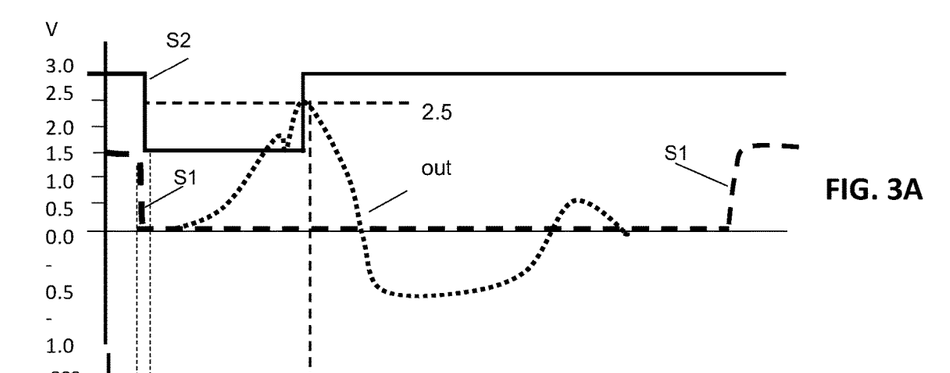
FIGS. 3A and 3B are graphs of a voltage and current, respectively, produced by the integrator circuit of FIG. 2.
Figure 3B:
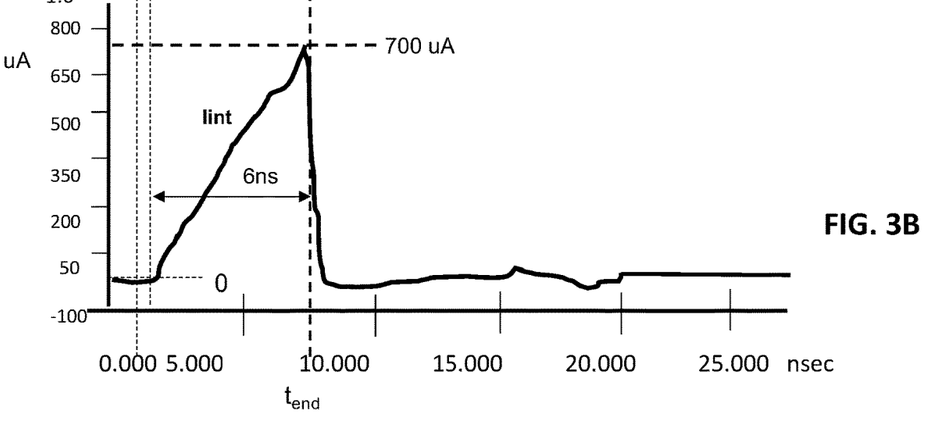

With reference to FIGS. 3A and 3B and continued reference to FIG. 2, the switch S1 251 is opened to sample and hold the VGS voltage of transistor 202. Shortly thereafter, the switch S2 252 is opened to disconnect the 1.5V voltage bias from the second transistor 204 and start the integration phase. In one embodiment, the input current source 209 is activated with the same S2 signal controlling the switch 252. FIG. FIG. 3A shows the voltage across the inductive load 210 reaching a maximum approximately 6 ns after the switch S2 252 is opened. This maximum is shown at approximately 10 ns (tend). Once the voltage across the inductive load 210 has settled, the S1 switch 251 is closed to start a new cycle including a new preset and integration phase.

Figure 4:
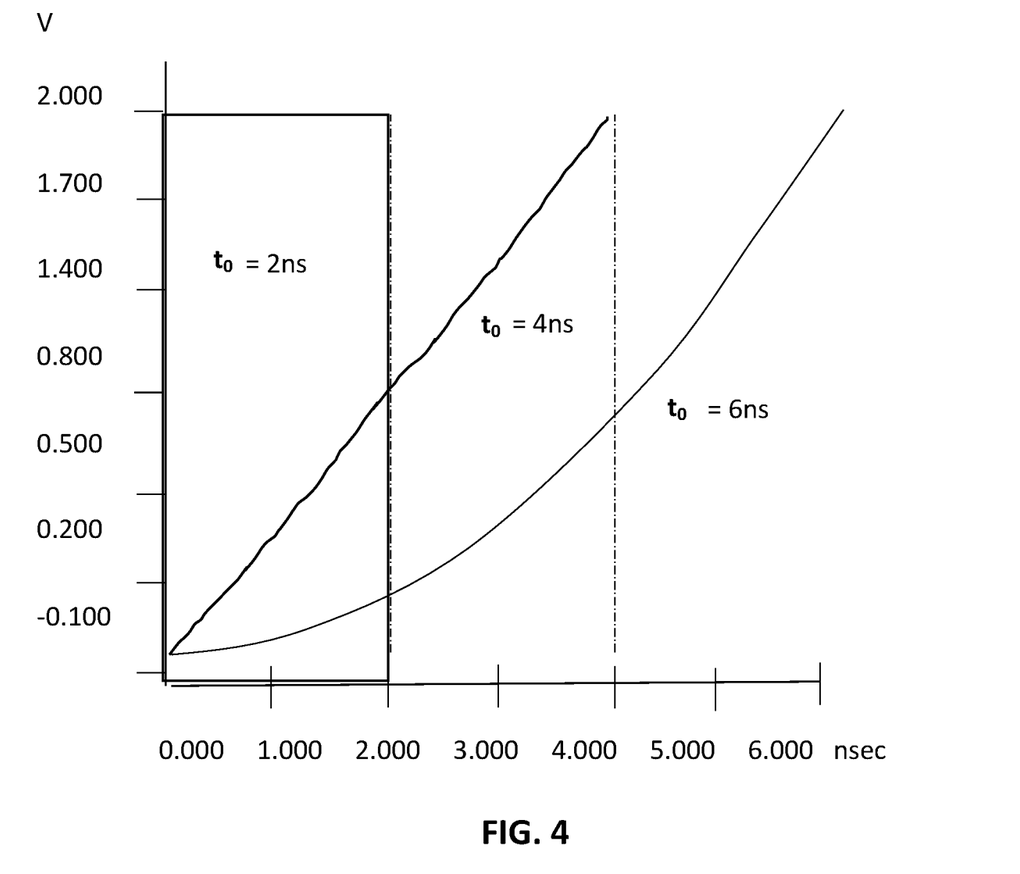
FIG. 4 is a graph illustrating various voltage waveforms that could be used to drive an inductive load in various embodiments of an integrator circuit.
Figure 5:
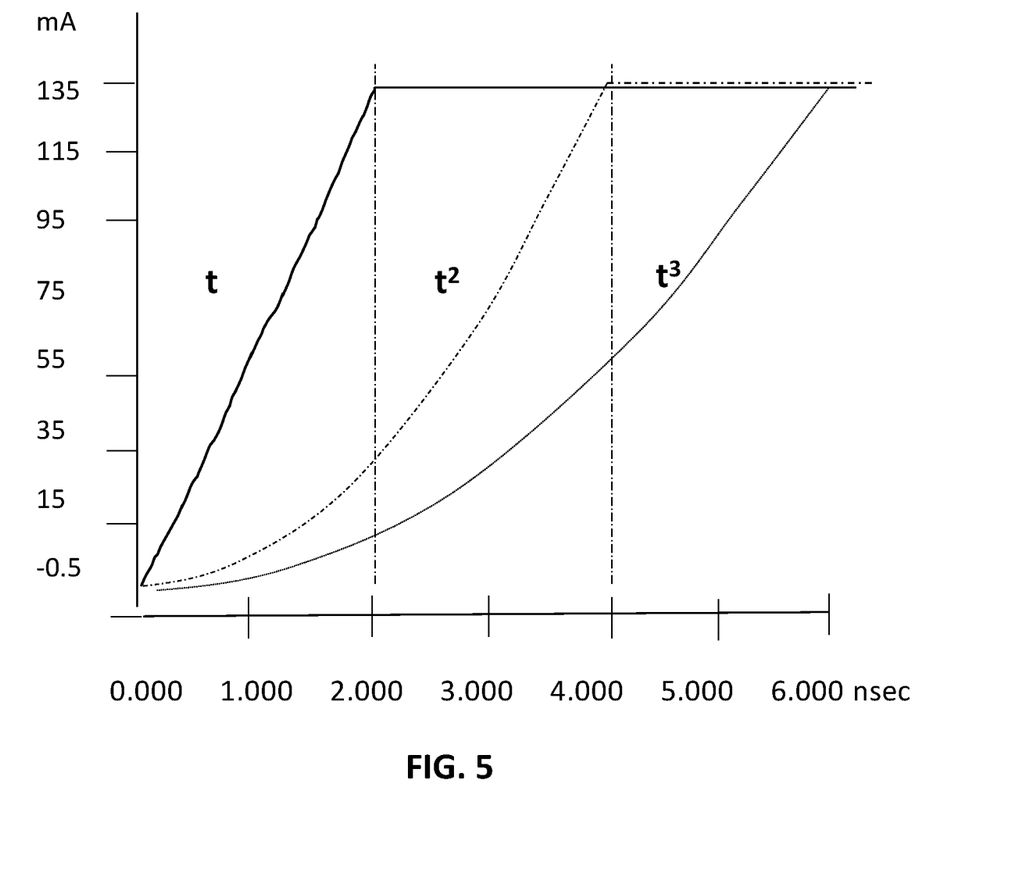
FIG. 5 is a graph of the coil currents corresponding to the pulses illustrated in FIG. 4.

FIG. 4 illustrates various voltage output waveforms that could be generated by an integrator circuit to drive an inductive load. Specifically, a square, linear and quadratic (t2) voltage waveform is shown. The quadratic voltage waveform is used by embodiments of the present disclosure because this waveform affords a longer integration cycle (e.g., 6 ns) to reach the same peak voltage. FIG. 5 with continued reference to FIG. 4, shows corresponding current waveforms flowing through the inductive load with a third order (t3 or "t3") being used by the present disclosure to extend the integration cycle to 6 ns. As discussed above a square voltage waveform across an inductive load results in a linear sloped ramp (t) current through the same load. A linear sloped voltage waveform (t) results in a quadratic current waveform (t2). A quadratic voltage waveform (t2) results in a third order current waveform (t**3).

Figure 6:
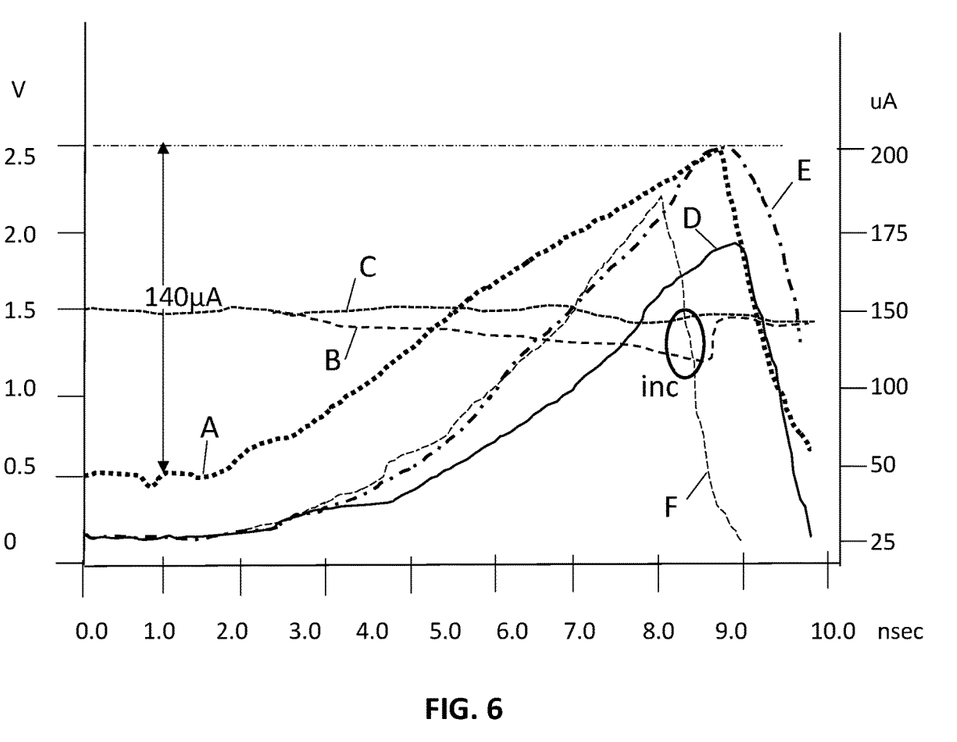
FIG. 6 is a graph illustrating various overlayed currents and voltages formed in the integrator circuit of FIG. 1.

FIG. 6 with reference to FIG. 2 shows various overlayed currents and voltages formed in the integrator circuit (e.g., FIG. 1 or FIG. 2) during the integration phase to further illustrate at least some of the advantages taught by the present disclosure. Waveform A shows one embodiment of a linear current ramp rising to 140 uA as sourced by the input current source 209. The waveform A is provided for illustrative purposes. In other embodiments, the Waveform A may show a ramp up to 700 uA with an elapsed integration time of 6 ns, or total elapsed time of approximately 9 ns. Waveform B shows the gate input voltage of transistor 204 (Vinc) without the benefit of forcing a constant IDS current through transistor 204 during the integration phase. In contrast to Waveform B, Waveform C shows a near constant gate input voltage to the transistor 204. Similarly, Waveforms D and E show the generated voltages across the inductive load 210 respectively with and without the constant IDS current forced through transistor 204 during the integration phase. Lastly, Waveform F shows an ideal voltage waveform across the inductive load 210, showing a larger developed voltage and a quadratic shape more closely matching that of Waveform E than Waveform F. With respect to Waveform D, almost 0.7V of peak voltage amplitude is lost due to integration current flowing to the gate of transistor 204.

Figure 7:
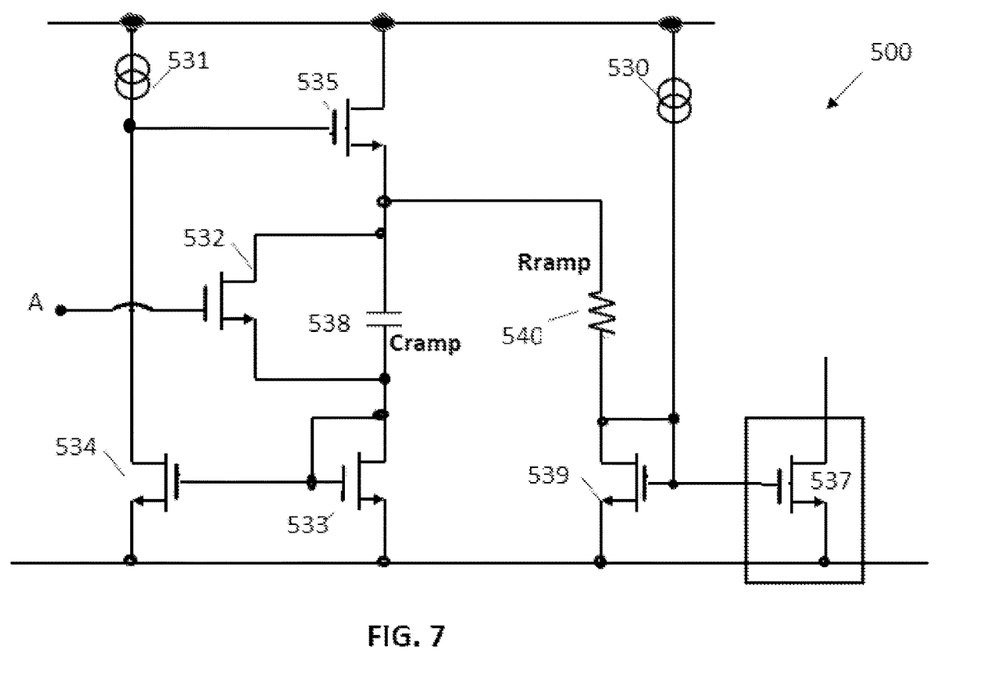
FIG. 7 is a schematic representation of an input current source for generating a linear current ramp, in accordance with an embodiment of the present disclosure.

FIG. 7 is a schematic representation of an input current source 500 for generating a linear current ramp, (e.g., the input current source 209) in accordance with an embodiment of the present disclosure. Prior to activating the input current source 500 by opening the transistor (clamp) 532, all the active transistor components are biased (e.g., transistors 532, 533, 534, 535, 537 and 539), while the passive components are not. This is done, to allow quick activation of the input current source 500. Specifically, the capacitor 538 is shorted, and the current sources 530 and 531 are chosen to source the same current to substantially eliminate current flow through the resistor 540. When the transistor 532 is opened (e.g., shut off with signal A or in some embodiments signal S2 of FIG. 2), the transistor 535 will force a linear ramp across the capacitor 538, according to the equation I=C*dv/dt, where I is the current from the current source 531, C is capacitance of capacitor 538 and dv/dt is the rate of voltage change across the capacitor 538. The resistor 540 being electrically in parallel with the capacitor 538 will receive the same linear current ramp. The drain of transistor 537 provides a linear current ramp (mirrored from the current flowing through resistor 540 and transistor 539) and may be coupled to the gate of the second transistor 204 of FIG. 2.

Figure 8A:
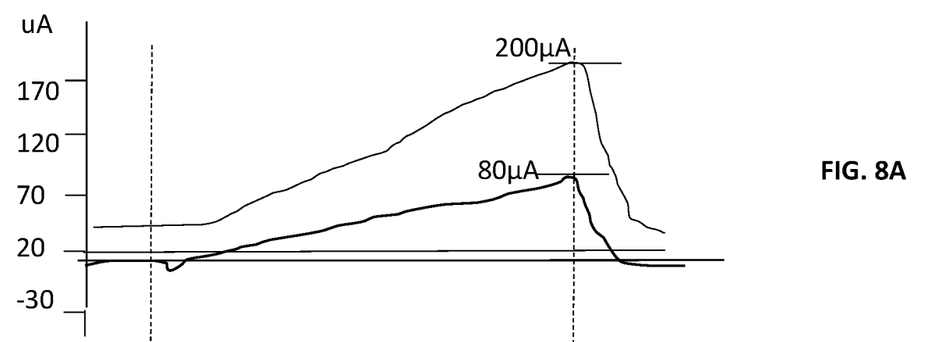
FIGS. 8A and 8B are graphs illustrating various voltages and currents formed in the current source of FIG. 7.
Figure 8B:
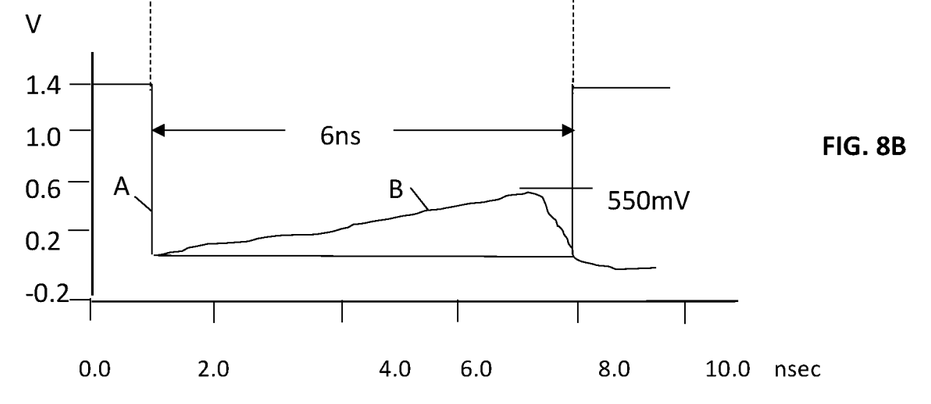

FIG. 8A and FIG. 8B show respective current and voltage waveforms for the embodiment of FIG. 7. In FIG. 8A, the current source 531 sources 25 uA to form a current ramp through the resistor 540 of up to 80 uA. The gain of the current mirror formed by transistors 537 and 539 thus provides a current output ramping to 200 uA. In other embodiments, the current of the current source 531 and/or the gain of the current mirror formed by transistors 537 and 539 may be adjusted to provide a current ramp of 700 uA or other suitable current maximum suited to the integrator circuit. FIG. 8B shows the ramped voltage at the source of the transistor 535 corresponding to the generated currents of FIG. 8A, starting at 1 ns and ending at 7 ns, for an elapsed time of 6 ns.

As will be appreciated, as least some of the embodiments as disclosed include at least the following embodiments. In one embodiment, an apparatus comprises a first transistor comprising a first gate, a first drain and a first source. A second transistor comprises a second gate, a second drain and a second source, the second gate coupled to a first current source configured to generate a linear current ramp, the second source coupled to the first gate and a second current source configured to generate a constant current through the second transistor determined by a sampled voltage between the first gate and the first source. A third transistor comprises a third gate, a third drain and a third source, the third gate coupled to the first drain, and the third source coupled to an inductive load, wherein the third transistor is configured to source a load current to the inductive load in response to an integration of the linear current ramp. A first capacitor is coupled between the third source and the second gate, the capacitor configured to integrate the linear current ramp.

Alternative embodiments of the apparatus include one of the following features, or any combination thereof. The second drain is coupled to a first voltage supply and the third drain is coupled to a second voltage supply, wherein the first voltage supply supplies a first voltage less than a second voltage of the second voltage supply. The first voltage is less than a peak value of the quadratic voltage. The second gate is preset to a voltage by a switch between the second gate and a voltage supply configured to supply the voltage, wherein the voltage is less than a peak value of the quadratic voltage. A replica transistor comprises a replica gate, a replica drain and replica source, the replica gate is switchably coupled to the first gate with a switch, the replica source is coupled to the first source and the replica drain coupled to a current mirror coupled to the second current source. A second capacitor is coupled to the replica gate, the second capacitor is configured to store the sampled voltage when the first switch is open. The first current source begins ramping the linear current ramp in response to an opening of a switch between the second gate and a voltage supply. The first current source comprises a plurality of transistors, a timing resistor and a timing capacitor, the first current source configured to bias each of the transistors, short the timing capacitor and minimize a current flow the timing resistor in response to a closing of a switch between the second gate a voltage supply. A replica transistor comprises a replica gate and a replica drain, the replica gate coupled to the third gate, the replica drain coupled to a current source and a feedback transistor coupled to the third gate, a first ratio of a constant third current supplied to the third drain divided by a current of the current source being defined by a second ratio of a first gain of the third transistor divided by a second gain of the replica transistor.

In another embodiment, an apparatus comprises a first transistor comprising a first gate, a first drain and a first source. A second transistor comprises a second gate and a second source, the second gate coupled to a first current source configured to generate a linear current ramp, the second source coupled to the first gate and a second current source configured to generate a constant current through the second transistor determined by a sampled voltage between the first gate and the first source. A third transistor comprises a third gate and a third source, the third gate coupled to the first drain, and the third source coupled to an inductive load, wherein the third transistor is configured to source a load current to the inductive load in response to an integration of the linear current ramp. A first capacitor is coupled between the third source and the second gate, wherein the sampled voltage is held on a second capacitor coupled to a replica gate of a replica transistor, the replica gate switchably connected to the second gate with a first switch, and a replica drain of the replica transistor coupled to a current mirror, the current mirror coupled to the second current source.

Alternative embodiments of the apparatus include one of the following features, or any combination thereof. The second gate is switchably coupled to a voltage supply with a second switch prior to the integration. The first switch is closed during a preset phase and the sampled voltage is sampled during the preset phase. The first switch is opened during the integration. The second switch is opened during the integration. The first current source begins ramping the linear current ramp in response to an opening of a second switch between the second gate and a voltage supply. A first switch is opened before opening a second switch coupled between the second gate and a voltage supply.

In another embodiment, an apparatus comprises a first transistor comprising a first gate, a first drain and a first source. A second transistor comprises a second gate and a second source, the second gate coupled to a first current source configured to generate a linear current ramp, the second source coupled to the first gate and a second current source configured to generate a constant current through the second transistor determined by a sampled voltage between the first gate and the first source. A third transistor comprises a third gate and a third source, the third gate coupled to the first drain, and the third source coupled to a load, wherein the third transistor is configured to source a load current to the load in response to an integration of the linear current ramp. A first capacitor is coupled between the third source and the second gate, wherein the sampled voltage is held on a second capacitor coupled to a replica gate of a replica transistor, the replica gate switchably connected to the second gate with a first switch, and a replica drain of the replica transistor coupled to a current mirror, the current mirror coupled to the second current source, and wherein the second gate is switchably coupled to a voltage supply with a second switch prior to the integration.

Alternative embodiments of the apparatus include one of the following features, or any combination thereof. The load is an inductive load. The load current from the third transistor generates a quadratic voltage across the load. An integrator input voltage on the second gate is constant during the integration.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An apparatus comprising:
   a first transistor comprising a first gate, a first drain and a first source;
   a second transistor comprising a second gate, a second drain and a second source, the second gate coupled to a first current source configured to generate a linear current ramp, the second source coupled to the first gate and a second current source configured to generate a constant current through the second transistor determined by a sampled voltage between the first gate and the first source;
   a third transistor comprising a third gate, a third drain and a third source, the third gate coupled to the first drain, and the third source coupled to an inductive load, wherein the third transistor is configured to source a load current to the inductive load in response to an integration of the linear current ramp; and
   a first capacitor coupled between the third source and the second gate, the first capacitor configured to integrate the linear current ramp.

2. The apparatus of claim 1 wherein the second drain is coupled to a first voltage supply and the third drain is coupled to a second voltage supply, wherein the first voltage supply supplies a first voltage less than a second voltage of the second voltage supply.

3. The apparatus of claim 2 wherein the first voltage is less than a peak value of a quadratic voltage.

4. The apparatus of claim 1 wherein the second gate is preset to a voltage by a switch between the second gate and a voltage supply configured to supply the voltage, wherein the voltage is less than a peak value of the quadratic voltage.

5. The apparatus of claim 4 further comprising a replica transistor comprising a replica gate, a replica drain and replica source, the replica gate switchably coupled to the first gate with a switch, the replica source coupled to the first source and the replica drain coupled to a current mirror coupled to the second current source.

6. The apparatus of claim 5 further comprising a second capacitor coupled to the replica gate, the second capacitor configured to store the sampled voltage when the first switch is open.

7. The apparatus of claim 1 wherein the first current source begins ramping the linear current ramp in response to an opening of a switch between the second gate and a voltage supply.

8. The apparatus of claim 1 wherein the first current source comprises: a plurality of transistors, the plurality of transistors comprising:
   a fourth transistor including a fourth drain coupled to a third current source, a fourth gate, and a fourth source coupled to the second gate of the second transistor;
   a fifth transistor including a fifth drain and a fifth gate coupled to the fourth gate, and a fifth source coupled to the fourth source;
   a sixth transistor including a sixth drain coupled to a node, a sixth gate coupled the fourth drain, and a sixth source coupled to a second node;
   a seventh transistor including a seventh drain coupled to the second node, a seventh gate configured to receive a control signal; and a seventh source coupled to the fifth drain;
   an eighth transistor including an eighth drain and an eighth gate coupled to a fourth current source and including an eighth source coupled to the fifth source;
   a ninth transistor including a ninth drain, a ninth gate coupled to the eight gate, and a ninth source coupled to the fourth source;
   a switch including a first terminal coupled to the second gate and a second terminal coupled to a voltage supply;
   a timing resistor including a first terminal coupled to the sixth source and a second terminal coupled to the eighth drain; and
   a timing capacitor including a first terminal coupled to the sixth source and a second terminal coupled to the fifth drain; and
   wherein the first current source is configured to bias each of the fourth, fifth, sixth, seventh, eighth, and ninth transistors, short the timing capacitor and minimize a current flow through the timing resistor in response to a closing of the switch between the second gate and the voltage supply.

9. The apparatus of claim 1 further comprising a replica transistor comprising a replica gate and a replica drain, the replica gate coupled to the third gate, the replica drain coupled to a current source and a feedback transistor coupled to the third gate, a first ratio of a constant third current supplied to the third drain divided by a current of the current source being defined by a second ratio of a first gain of the third transistor divided by a second gain of the replica transistor.

10. An apparatus comprising:
    a first transistor comprising a first gate, a first drain and a first source;
    a second transistor comprising a second gate and a second source, the second gate coupled to a first current source configured to generate a linear current ramp, the second source coupled to the first gate and a second current source configured to generate a constant current through the second transistor determined by a sampled voltage between the first gate and the first source;
    a third transistor comprising a third gate and a third source, the third gate coupled to the first drain, and the third source coupled to an inductive load, wherein the third transistor is configured to source a load current to the inductive load in response to an integration of the linear current ramp; and
    a first capacitor coupled between the third source and the second gate, wherein the sampled voltage is held on a second capacitor coupled to a replica gate of a replica transistor, the replica gate switchably connected to the second gate with a first switch, and a replica drain of the replica transistor coupled to a current mirror, the current mirror coupled to the second current source.

11. The apparatus of claim 10 wherein the second gate is switchably coupled to a voltage supply with a second switch prior to the integration.

12. The apparatus of claim 11 wherein the first switch is closed during a preset phase and the sampled voltage is sampled during the preset phase.

13. The apparatus of claim 12 wherein the first switch is opened during the integration.

14. The apparatus of claim 12 wherein the second switch is opened during the integration.

15. The apparatus of claim 10 wherein the first current source begins ramping the linear current ramp in response to an opening of a second switch between the second gate and a voltage supply.

16. The apparatus of claim 10 wherein the first switch is opened before opening a second switch coupled between the second gate a voltage supply.

17. An apparatus comprising:
- a first transistor comprising a first gate, a first drain and a first source;
- a second transistor comprising a second gate and a second source, the second gate coupled to a first current source configured to generate a linear current ramp, the second source coupled to the first gate and a second current source configured to generate a constant current through the second transistor determined by a sampled voltage between the first gate and the first source;
- a third transistor comprising a third gate and a third source, the third gate coupled to the first drain, and the third source coupled to a load, wherein the third transistor is configured to source a load current to the load in response to an integration of the linear current ramp; and
- a first capacitor coupled between the third source and the second gate, wherein the sampled voltage is held on a second capacitor coupled to a replica gate of a replica transistor, the replica gate switchably connected to the second gate with a first switch, and a replica drain of the replica transistor coupled to a current mirror, the current mirror coupled to the second current source, and wherein the second gate is switchably coupled to a voltage supply with a second switch prior to the integration.

18. The apparatus of claim 17 wherein the load is an inductive load.

19. The apparatus of claim 17 wherein the load current from the third transistor generates a quadratic voltage across the load.

20. The apparatus of claim 17 wherein an integrator input voltage on the second gate is constant during the integration.

* * * * *